United States Patent
Tu et al.

(10) Patent No.: US 7,345,608 B2
(45) Date of Patent: Mar. 18, 2008

(54) DELTA-SIGMA DAC

(75) Inventors: Wei-Hsuan Tu, Hsinchu (TW); Tse-Hsiang Hsu, Hsin-Chu (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 11/609,477

(22) Filed: Dec. 12, 2006

(65) Prior Publication Data

US 2007/0152857 A1 Jul. 5, 2007

Related U.S. Application Data

(60) Provisional application No. 60/755,355, filed on Dec. 30, 2005.

(51) Int. Cl.
*H03M 3/00* (2006.01)

(52) U.S. Cl. ..................... 341/143; 341/144

(58) Field of Classification Search ......... 341/143–160
See application file for complete search history.

(56) References Cited

U.S. PATENT DOCUMENTS

| 4,181,895 | A | 1/1980 | Yoshida |
| 4,975,963 | A | 12/1990 | Liberman |
| 5,537,081 | A | 7/1996 | Naokawa et al. |
| 6,323,795 | B1 * | 11/2001 | Yang et al. ................. 341/143 |
| 6,531,973 | B2 * | 3/2003 | Brooks et al. ............. 341/143 |
| 6,816,097 | B2 * | 11/2004 | Brooks et al. ............. 341/143 |
| 6,950,049 | B2 * | 9/2005 | Brooks et al. ............. 341/143 |

* cited by examiner

*Primary Examiner*—Lam T. Mai
(74) *Attorney, Agent, or Firm*—Thomas, Kayden, Horstemeyer & Risley

(57) ABSTRACT

A Delta-Sigma DAC is provided, comprising an interpolator, a Delta-Sigma modulator, a FIR filter and an analog filter. The interpolator oversamples a n-bit digital signal to generate a n-bit oversampled signal. The Delta-Sigma modulator coupled to the output of interpolator shapes the n-bit oversampled digital signal to generate a shaped digital signal. The FIR filter coupled to the Delta-Sigma modulator filters the shaped digital signal to generate an analog audio signal. The analog filter coupled to the FIR filter amplifies the analog audio signal to generate a audible signal.

10 Claims, 7 Drawing Sheets

DELTA-SIGMA DAC

CROSS REFERENCE TO RELATED APPLICATIONS

This application claims the benefit of U.S. Provisional Application No. 60/755,355, filed on Dec. 30, 2005.

BACKGROUND OF THE INVENTION

1. Field of the Invention

The invention relates to audio devices, and in particular, to anti-glitch devices in audio DACs.

2. Description of the Related Art

FIG. 1 shows a conventional Delta-Sigma DAC for converting a 16-bit digital signal to an audible signal Vout. The Delta-Sigma technique is popular because it achieves high resolution and quality with effective hardware implementations. An interpolator 102 receives an n-bit digital signal at a first sampling rate, and performs an interpolation to generate an n-bit output signal at a second, higher sampling rate. A Delta-Sigma modulator 104 receives the output signal from the interpolator 102 and shapes the quantization noises therein, thereby generating a shaped signal as a substantially linear analog representation of the 16-bit digital signal within a pass band. A DAC 106 then converts the shaped signal to an analog form, and a filter 110 filters high frequency noises therein to output the audible signal Vout.

When powering up, a system clock (not shown) requires a period of transient time to settle, and the Delta-Sigma modulator 104 also takes time to converge to stability. Random digital signals may be generated during the period, and amplified by the DAC 106 to output glitch noise. In the filter 110, an inverter 120 is conventionally implemented to avoid power-up glitches. A logic high signal is input to the inverter 120 when powering up, thus the inverter 120 enters a high impedance (High-Z) mode that forms an equivalent open circuit for the output node A. In this way, the power-up glitches are not passed to the output of filter 110. When the Delta-Sigma modulator 104 completes initialization, a zero pattern is output, and the inverter 120 returns to normal mode from the High-Z mode, passing the zero pattern to the filter 110. The zero pattern does not generate audible sounds through the filter 110. Additionally, a reference voltage Vref for the operational amplifier OP1 is coupled to ground by a switch 112 according to the control signal #ctrl when powering up, and the filter 110 forms a unity gain buffer that is also capable of avoiding power-up glitches. The reference voltage Vref is typically cascaded to a large capacitor (not shown) to obtain higher SNR. When the inverter 120 returns from High-Z mode to normal mode, the control signal #ctrl simultaneously switches to a logic low, such that the reference voltage Vref gradually increases to its operating point according to the RC constant.

In FIG. 1, an alternative implementation provides an output switch 114 coupled to the output of the operational amplifier OP1. The output switch 114 as well as the switch 112, may be a NMOS. When powering up, a control signal #ctrl of logic high is sent to the output switch 114, coupling the audible signal Vout to ground. The power-up glitches output from the operational amplifier OP1 are thus instantly avoided.

The High-Z mode solution, however, cannot be applied to finite impulse response (FIR) based Delta-Sigma DACs or switched capacitor architectures. Additionally, the zero patterns generated from the Delta-Sigma modulator 104 may still render glitches since the duty cycle transient of the zero pattern is unpredictable for the filter 110. The output switch 114 may not effectively pull the audible signal Vout to ground because the operational amplifier OP1 may output a significantly large loading. An improved anti-glitch circuit is therefore desirable.

BRIEF SUMMARY OF THE INVENTION

A detailed description is given in the following embodiments with reference to the accompanying drawings.

A Delta-Sigma DAC is provided, comprising an interpolator, a Delta-Sigma modulator, a FIR filter and an analog filter. The interpolator oversamples a n-bit digital signal to generate a n-bit oversampled signal. The Delta-Sigma modulator coupled to the output of interpolator, shapes the n-bit oversampled digital signal to generate a shaped digital signal. The FIR filter coupled to the Delta-Sigma modulator filters the shaped digital signal to generate an analog audio signal. The analog filter coupled to the FIR filter, amplifies the analog audio signal to generate a audible signal.

When the Delta-Sigma DAC powers up, a mute signal is enabled to disable the analog filter, thus the audible signal is not output. When the shaped digital signal comprises a zero pattern, the mute signal is disabled, and the analog filter is enabled to output the audible signal.

The analog filter may comprise an operational amplifier, a passive component, and a first switch. The operational amplifier controlled by the mute signal, comprises a first input node receiving the analog audio signal, a second input node receiving a reference voltage, and an output node outputting the audible signal. The passive component is coupled to the output node and first input node of the operational amplifier. The first switch is coupled to the second input node of the operational amplifier, receiving a control signal. When the Delta-Sigma DAC powers up, the control signal is enabled, such that the first switch couples the reference voltage to a relative ground, and the mute signal is simultaneously enabled, such that the output node of operational amplifier is coupled to the relative ground. When the shaped digital signal comprises a zero pattern, the control signal is disabled, and the reference voltage is input to the second input node. A second switch may further be coupled to the output node, controlled by the control signal. When the control signal is enabled, the second switch couples the output node of operational amplifier to the relative ground.

The operational amplifier comprises three stages. A differential input stage having the first and second input nodes, receives the analog audio signal and the reference voltage. A gain stage coupled to the differential input stage, adjusts gain of the output therefrom. An output stage coupled to the gain stage, has the output node that renders the audible signal. The mute signal may be sent to the output stage. When the mute signal is enabled, the output stage couples the output node to the relative ground.

The output stage may comprise at least three MOS devices. A first PMOS has a source coupled to a power supply, and a drain coupled to the output node. A first NMOS has a drain coupled to the output node, and a source coupled to a power sink. A second PMOS has a source coupled to the power supply, a drain coupled to the gate of first NMOS, and a gate coupled to the mute signal. When the mute signal is enabled as a logic low, the second PMOS and first NMOS are activated, and the output node is pulled to the power sink as the relative ground. Alternatively, the second PMOS may be substituted by a second NMOS. Thus when the mute signal is enabled as a logic high, the second NMOS and first NMOS are activated, and the output node is pulled to the power sink as the relative ground.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
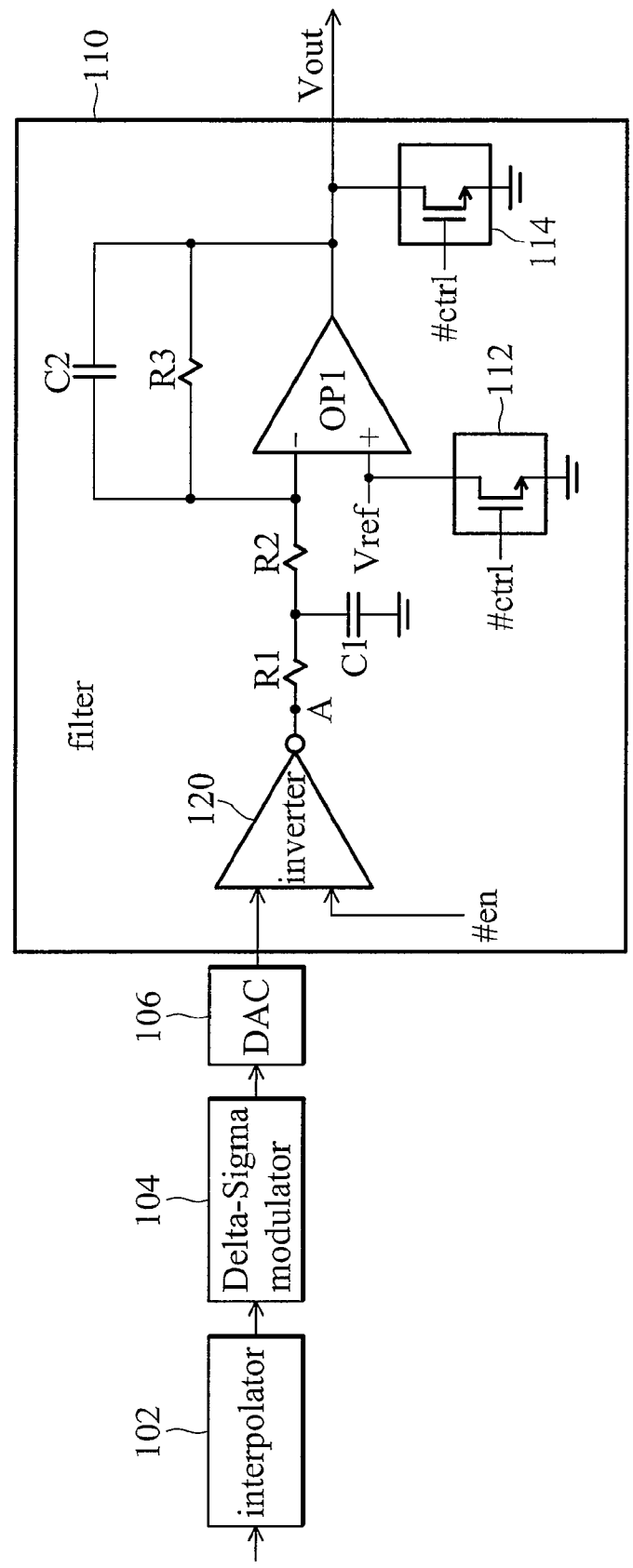
FIG. 1 shows a conventional Delta-Sigma DAC.
Figure 2:
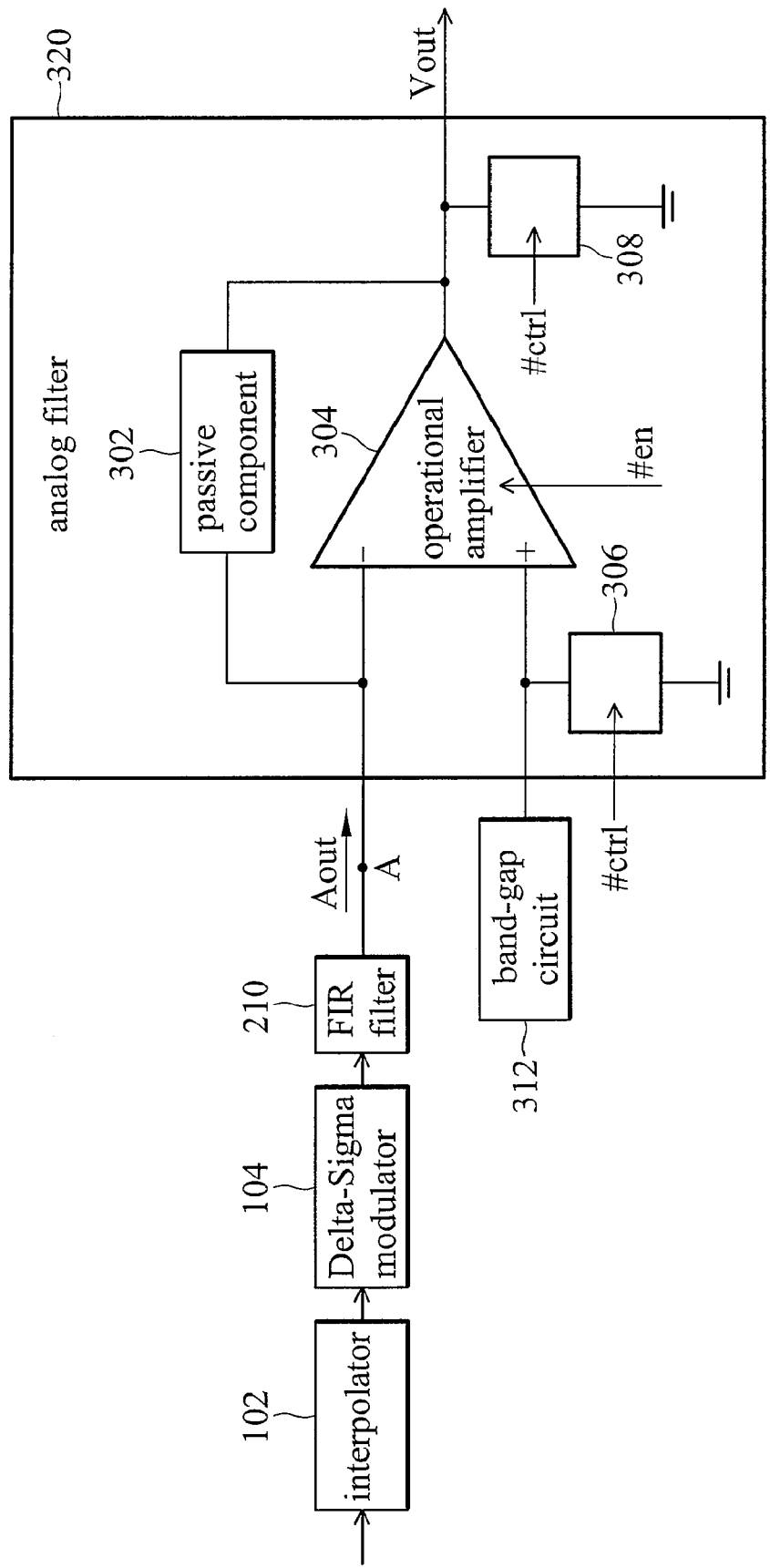
FIG. 2 shows an embodiment of a Delta-Sigma DAC according to the invention.

FIG. 2 shows an embodiment of a Delta-Sigma DAC according to the invention. The Delta-Sigma DAC comprises an interpolator 102, a Delta-Sigma modulator 104, a FIR filter 210 and an analog filter 320. The analog filter 320 comprises a passive component 302, an operational amplifier 304, a first switch 306 and a second switch 308. The passive component 302 is coupled to the output node and first input node of the operational amplifier 304. The first switch 306 is coupled to the second input node of the operational amplifier 304, receiving a control signal #ctrl. The operational amplifier 304 comprises a first input node, a second input node, and an output node. The first input node receives the analog audio signal, the second input node receives a reference voltage Vref, and the output node outputs the audible signal. The operational amplifier 304 is a modified version that outputs no signal when powering up. When the Delta-Sigma DAC powers up, a mute signal #en is sent to the analog filter 320, and the output of operational amplifier 304 is disabled accordingly, thus no audible signal Vout is output. Specifically, the mute signal #en disables the operational amplifier 304 by coupling the output node of operational amplifier 304 to the relative ground. Simultaneously, the control signal #ctrl is enabled when the Delta-Sigma DAC powers up, such that the first switch 306 couples the reference voltage Vref to the relative ground. In this way, the operational amplifier 304 functions as an unity gain buffer that economizes unnecessary driving power. When the Delta-Sigma DAC completes the power up initialization, the shaped digital signal generated from the Delta-Sigma modulator 104 comprises a zero pattern, such that the control signal #ctrl and the mute signal #en are disabled, and the reference voltage Vref is sent to the analog filter 320 via the second input node, making the analog filter 320 operative to output the audible signal Vout.

Figure 3:
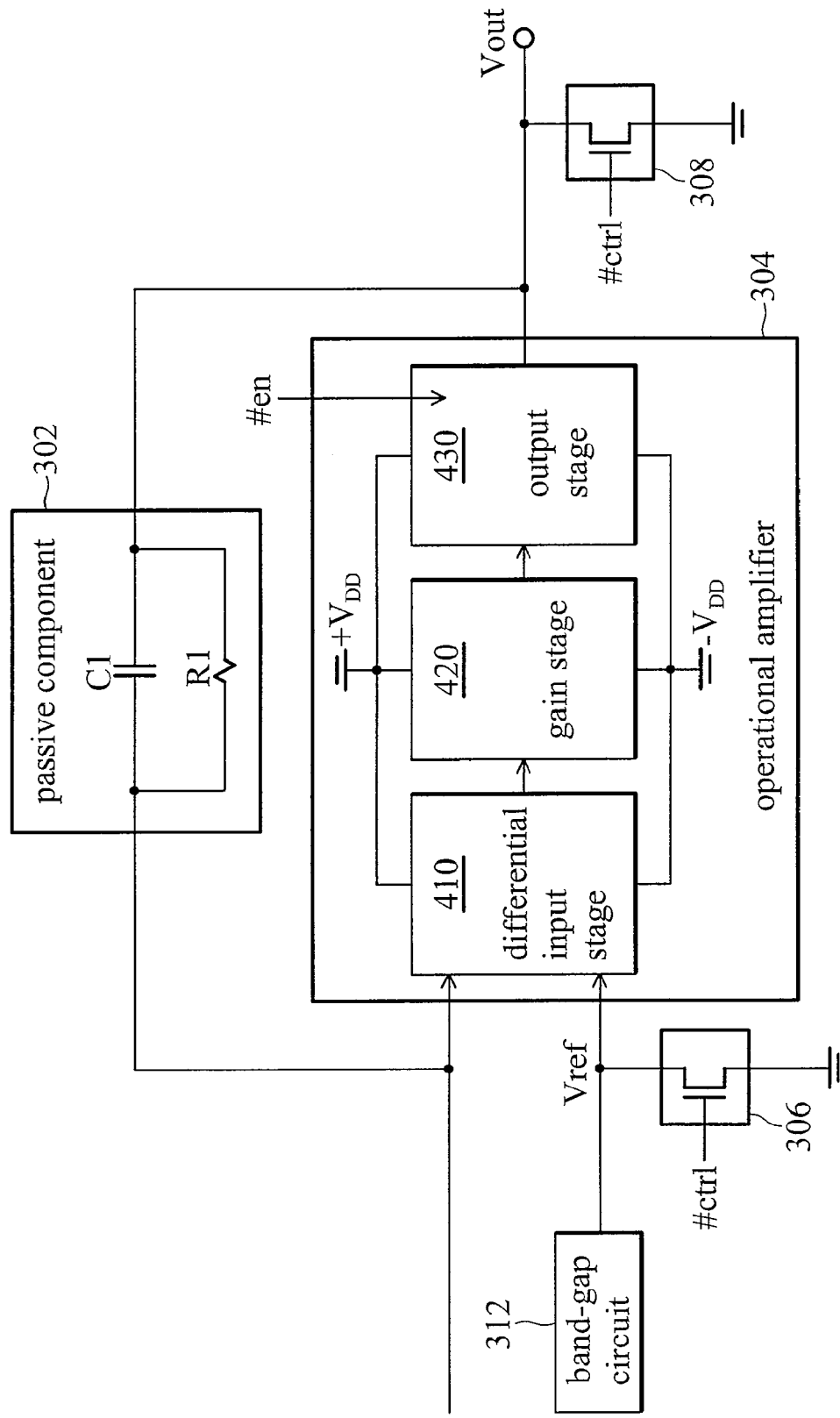
FIG. 3 shows an embodiment of the analog filter 320 according to FIG. 2.

FIG. 3 shows an embodiment of the analog filter 320 according to FIG. 2. The Delta-Sigma DAC may further comprise a second switch 308 coupled to the output node, controlled by the control signal #ctrl that controls the first switch 306. When the control signal #ctrl is enabled, the second switch 308 couples the output node of operational amplifier 304 to the relative ground, providing a further guarantee to avoid power-up glitches. The first switch 306 and second switch 308 may be simultaneously NMOS, and the control signal #ctrl is enabled as a logic high. Otherwise, if the first switch 306 and second switch 308 are identically implemented by PMOS, the control signal #ctrl is enabled as a logic low.

In FIG. 3, the operational amplifier 304 comprises a differential input stage 410, a gain stage 420 and an output stage 430. The differential input stage 410 has the first and second input nodes, receiving the analog audio signal and the reference voltage Vref. The gain stage 420 is coupled to the differential input stage 410, adjusting gain of the output therefrom. The output stage 430 is coupled to the gain stage 420, having the output node that renders the audible signal. The three stages are based on conventional operational amplifier architecture, and the embodiment provides a modified output stage 430 to avoid power-up glitches. The mute signal #en is sent to the output stage 430. When the mute signal is enabled, the output stage 430 couples the output node to the relative ground. The passive component 302 may be a RC circuit comprising a capacitor C1 and a resistor R1 cascaded in parallel. The operational amplifier 304 is powered by a power supply +Vdd and a power sink power sink −Vdd, whereas the power sink power sink −Vdd may also be referred to as the relative ground.

Figure 4:
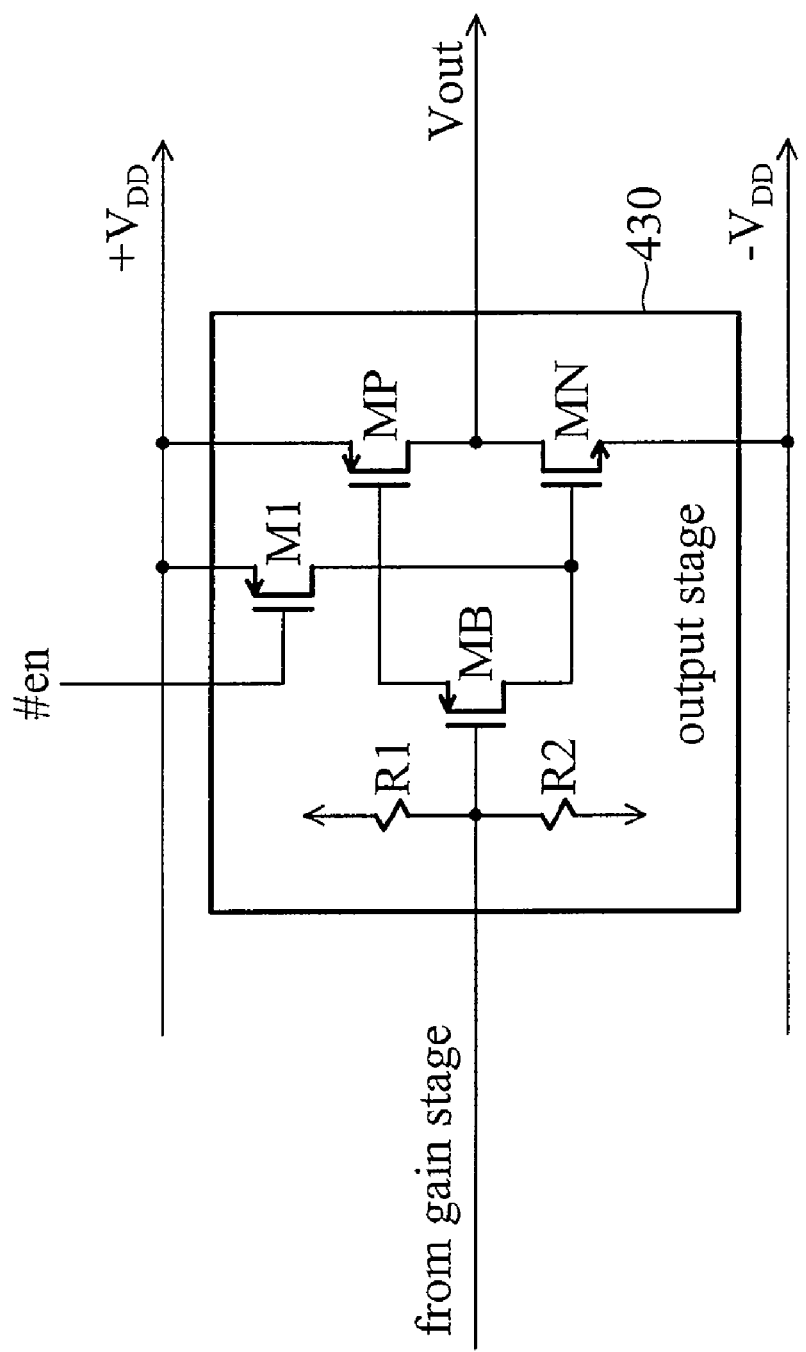
FIGS. 4 and 5 show embodiments of the output stage 430 in FIG. 3.
Figure 5:
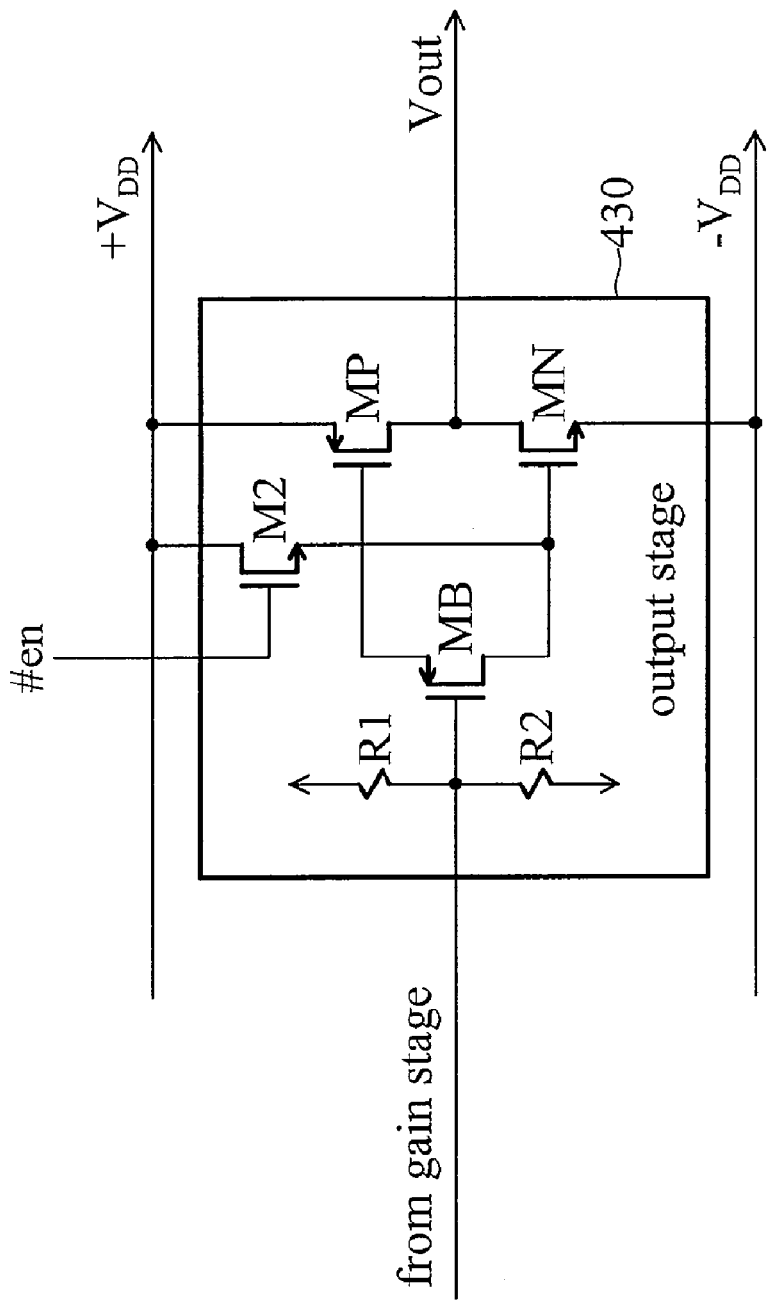

FIGS. 4 and 5 show embodiments of the output stage 430 in FIG. 3. In FIG. 4, the output stage 430 comprises a first PMOS MP, a first NMOS MN and a second PMOS M1. The first PMOS MP has a source coupled to power supply +Vdd, and a drain coupled to the output node. The first NMOS MN has a drain coupled to the output node, and a source coupled to power sink power sink −Vdd. The second PMOS M1 has a source coupled to power supply +Vdd, a drain coupled to the gate of first NMOS MN, and a gate coupled to the mute signal #en. When the mute signal #en is enabled as a logic low, the second PMOS M1 and first NMOS MN are activated, and the audible signal Vout is pulled to power sink −Vdd.

FIG. 5 shows an alternative implementation of the output stage 430. The second PMOS M1 is substituted by a second NMOS M2 having a drain coupled to power supply +Vdd, a source coupled to the gate of first NMOS MN, and a gate coupled to the mute signal. When the mute signal is enabled as a logic high, the second NMOS M2 and first NMOS MN are activated, and the audible signal Vout is pulled to the power sink −Vdd.

In FIGS. 4 and 5, the first NMOS MN and first PMOS MP form a push-pull circuit in the output stage of the operational amplifier, and the gates thereof may couple to a PMOS MB for bias control. The implementation varies from different operational amplifiers, thus the major concept of the invention is to provide a modified logic that pulls the audible signal Vout of the operational amplifier 304 to ground. Alternatively, the pull down mechanism may be implemented in other stages of the operational amplifier.

Figure 6A:
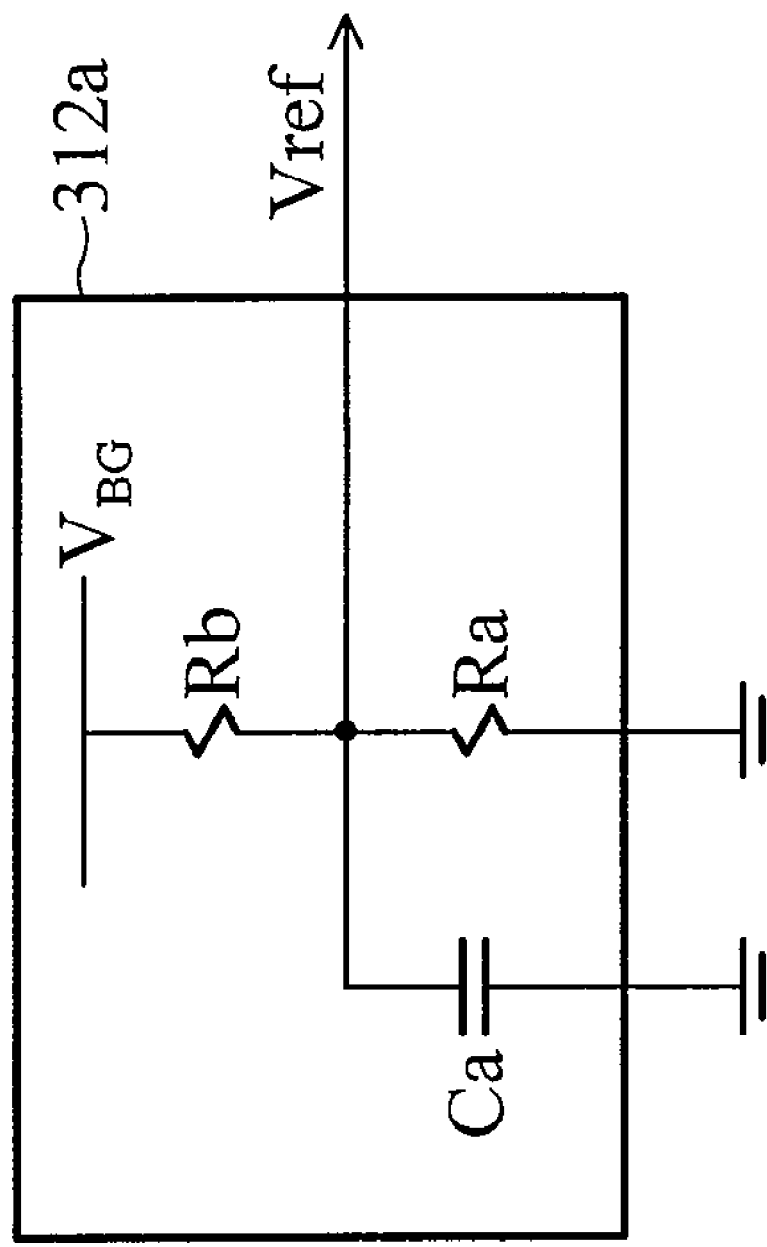
FIGS. 6a and 6b show embodiments of the band-gap circuit 312 in FIG. 3.
Figure 6B:
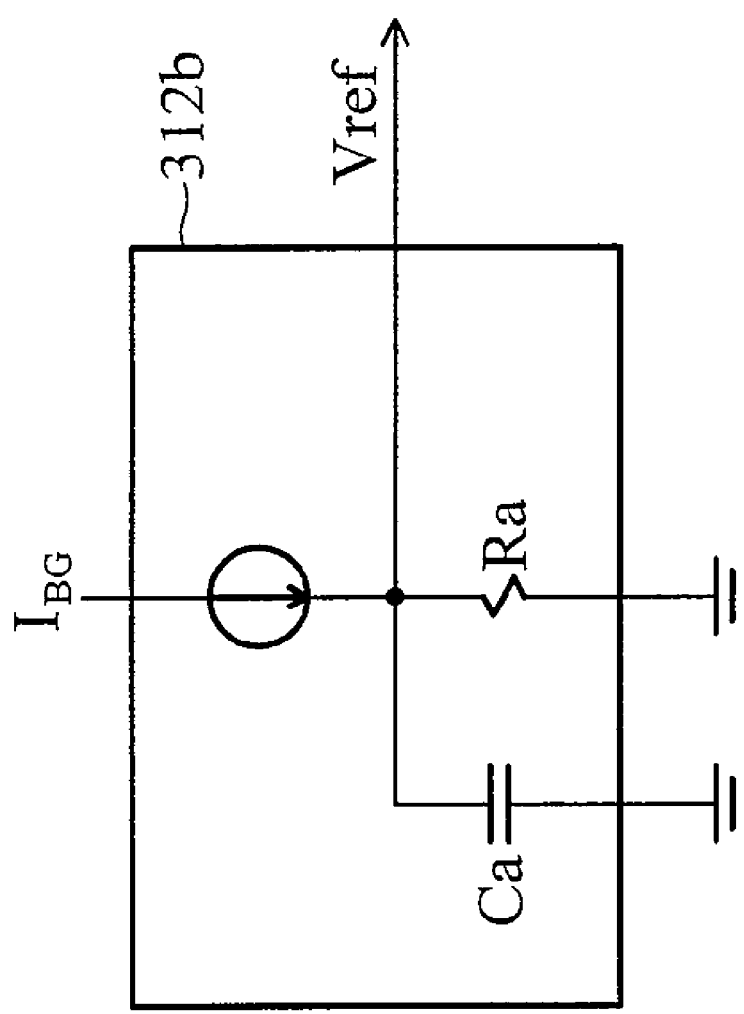

FIGS. 6a and 6b show embodiments of the band-gap circuit 312 in FIG. 3. In FIG. 6a, the band-gap circuit 312 comprises a first resistor Ra and a first capacitor Ca, parallel coupled to a reference node and the relative ground. A second resistor Rb is coupled to a band-gap voltage source and the reference node. The reference voltage Vref is output from the reference node. In FIG. 6b, a band-gap current source, rather than the second resistor Rb, is coupled to the reference node, providing the reference voltage Vref through the reference node.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A Delta-Sigma DAC, comprising:
    an interpolator, over-sampling a n-bit digital signal to generate a n-bit oversampled signal;
    a Delta-Sigma modulator, coupled to the output of interpolator, shaping the n-bit oversampled digital signal to generate a shaped digital signal;
    a FIR filter, coupled to the Delta-Sigma modulator, filtering the shaped digital signal to generate an analog audio signal; and
    an analog filter, coupled to the FIR filter, amplifying the analog audio signal to generate a audible signal; wherein:
    when the Delta-Sigma DAC powers up, a mute signal is enabled to disable the analog filter, thus the audible signal is not output; and
    when the shaped digital signal comprises a zero pattern, the mute signal is disabled, and the analog filter is enabled to output the audible signal.

2. The Delta-Sigma DAC as claimed in claim 1, wherein the analog filter comprises:
    an operational amplifier, controlled by the mute signal, comprising:
        a first input node receiving the analog audio signal;
        a second input node receiving a reference voltage; and
        an output node outputting the audible signal;
    a passive component coupled to the output node and first input node of the operational amplifier;
    a first switch coupled to the second input node of the operational amplifier, receiving a control signal; wherein:
    when the Delta-Sigma DAC powers up:
        the control signal is enabled, such that the first switch couples the reference voltage to a relative ground; and
        the mute signal is enabled, such that the output node of operational amplifier is coupled to the relative ground;
    when the shaped digital signal comprises a zero pattern, the control signal is disabled, and the reference voltage is input to the second input node.

3. The Delta-Sigma DAC as claimed in claim 2, further comprising a second switch coupled to the output node, controlled by the control signal; wherein when the control signal is enabled, the second switch couples the output node of operational amplifier to the relative ground.

4. The Delta-Sigma DAC as claimed in claim 3, wherein the first switch and second switch are NMOS, and the control signal is enabled as a logic high.

5. The Delta-Sigma DAC as claimed in claim 3, wherein the first switch and second switch are PMOS, and the control signal is enabled as a logic low.

6. The Delta-Sigma DAC as claimed in claim 2, wherein the operational amplifier comprises:
    a differential input stage, having the first and second input nodes, receiving the analog audio signal and the reference voltage;
    a gain stage, coupled to the differential input stage, and adjusting gain of the output therefrom; and
    a output stage, coupled to the gain stage, having the output node that renders the audible signal; wherein:
    the mute signal is sent to the output stage; and
    when the mute signal is enabled, the output stage couples the output node to the relative ground.

7. The Delta-Sigma DAC as claimed in claim 6, wherein the output stage comprises:
    a first PMOS, having a source coupled to a power supply, and a drain coupled to the output node;
    a first NMOS, having a drain coupled to the output node, and a source coupled to a power sink; and
    a second PMOS, having a source coupled to the power supply, a drain coupled to the gate of first NMOS, and a gate coupled to the mute signal; wherein when the mute signal is enabled as a logic low, the second PMOS and first NMOS are activated, and the output node is pulled to the power sink as the relative ground.

8. The Delta-Sigma DAC as claimed in claim 6, wherein the output stage comprises:
    a first PMOS, having a source coupled to the power supply, and a drain coupled to the output node;
    a first NMOS, having a drain coupled to the output node, and a source coupled to the power sink; and
    a second NMOS, having a drain coupled to power supply, a source coupled to the gate of first NMOS, and a gate coupled to the mute signal; wherein when the mute signal is enabled as a logic high, the second NMOS and first NMOS are activated, and the output node is pulled to the power sink as the relative ground.

9. The Delta-Sigma DAC as claimed in claim 1, further comprising a band-gap circuit providing the reference voltage, comprising:
    a first resistor and a first capacitor, parallel coupled to a reference node and the relative ground; and
    a second resistor coupled to a band-gap voltage source and the reference node; wherein the reference voltage is output from the reference node.

10. The Delta-Sigma DAC as claimed in claim 1, further comprising a band-gap circuit providing the reference voltage, comprising:
    a first resistor and a first capacitor, parallel coupled to a reference node and the relative ground; and
    a band-gap current source coupled to the reference node, wherein the reference voltage is output from the reference node.

* * * * *